US006926925B2

(12) United States Patent
Thebault et al.

(10) Patent No.: US 6,926,925 B2
(45) Date of Patent: Aug. 9, 2005

(54) METHOD OF MAKING A CONTINUOUS COATING ON THE SURFACE OF A PART

(75) Inventors: Jacques Thebault, Bordeaux (FR); Jean-Eric Pelletan, Saint Medard en Jalles (FR); Laurent David, Blanquefort (FR); Philippe Girard, Le Pian Medoc (FR)

(73) Assignee: Snecma Propulsion Solide, Le Haillan (FR)

( * ) Notice: Subject to any disclaimer, the term of this patent is extended or adjusted under 35 U.S.C. 154(b) by 0 days.

(21) Appl. No.: 10/250,419

(22) PCT Filed: Nov. 5, 2002

(86) PCT No.: PCT/FR02/03775

§ 371 (c)(1),
(2), (4) Date: Jul. 1, 2003

(87) PCT Pub. No.: WO03/040429

PCT Pub. Date: May 15, 2003

(65) Prior Publication Data

US 2004/0028813 A1 Feb. 12, 2004

(30) Foreign Application Priority Data

Nov. 6, 2001 (FR) .............................................. 01 14313

(51) Int. Cl.[7] .............................................. C23C 16/00
(52) U.S. Cl. ................................ 427/248.1; 427/249.2; 427/900; 427/154; 427/289
(58) Field of Search .............................. 427/248.1, 154, 427/133, 289

(56) References Cited

U.S. PATENT DOCUMENTS

| 4,472,476 | A |   | 9/1984 | Veltri et al. |
| 4,752,503 | A |   | 6/1988 | Thebault |
| 4,823,734 | A |   | 4/1989 | Christin |
| 5,175,929 | A | * | 1/1993 | Anthony et al. ........ 29/890.142 |
| 5,869,133 | A | * | 2/1999 | Anthony et al. .......... 427/249.8 |
| 6,231,923 | B1 | * | 5/2001 | Teverovsky et al. ..... 427/248.1 |
| 6,258,227 | B1 | * | 7/2001 | Flanigan ................. 204/298.11 |
| 6,659,161 | B1 | * | 12/2003 | Sung ........................... 164/74 |

* cited by examiner

*Primary Examiner*—Bret Chen
(74) *Attorney, Agent, or Firm*—Weingarten, Schurgin, Gagnebin & Lebovici LLP

(57) ABSTRACT

A method and apparatus for a continuous coating of a part may include providing a separation layer made of a material that is weaker than the material of the coating to be made. The part may be placed on one or more supports, the supports coated with the separation layer. A continuity layer of a component material of the coating to be made is interposed between the part and the or each support, at least in vicinity of the or each support zone. The coating is formed by chemical vapor infiltration or deposition, and the part is then separated from the or each support by rupture within the separation layer, the continuity of the coating of the part in the or each support zone being provided by the portion of the coating that comes from the continuity layer that remains in place on the part.

24 Claims, 4 Drawing Sheets

METHOD OF MAKING A CONTINUOUS COATING ON THE SURFACE OF A PART

This application is a 371 national phase filing of PCT/FR02/03775 filed Nov. 5, 2002, and claims priority to a French application No. 01 14313 filed Nov. 6, 2001.

BACKGROUND OF THE INVENTION

The invention relates to making continuous coating on the surface of a part.

The field of application of the invention is more particularly making a protective coating on parts made of a material that is sensitive to corrosion by oxidation and/or to forming a coating for sealing parts made of a refractory porous material.

The materials concerned are typically carbon, graphite, and thermostructural composite materials such as carbon/carbon (C/C) composites and ceramic matrix composite with carbon fiber reinforcement (e.g. C/SiC composites) or with ceramic fiber reinforcement (e.g. SiC/SiC), in which case carbon can be present in an interphase between ceramic fibers and the ceramic matrix.

Depending on the intended use, forming continuous coatings on the outside surfaces of parts made of such materials is necessary in order to ensure they behave well in an oxidizing medium at high temperature, and/or in order to seal their surfaces, given that materials such as carbon, graphite, and above all thermostructural composites, all possess internal porosity to a greater or lesser extent.

A coating layer may be formed by a gaseous technique, possibly combined with a liquid technique (a combined technique).

The gaseous technique consists in chemical vapor infiltration or deposition. A gas containing at least one precursor for the material of the coating that is to be made is brought into contact with the part under conditions of temperature and pressure that encourage the formation of said material by decomposition of the precursor or by reaction between a plurality of components thereof. With chemical vapor infiltration, the coating material is likewise deposited within the pores of the material of the part, and a surface coating is formed after the pores have been filled in, at least in the vicinity of the surface.

The liquid technique consists in coating the surface of the part in a liquid that is a precursor of the coating material, typically a resin, possibly together with a solvent and a filler. After cross-linking, the precursor is transformed by applying heat treatment. The coating is finished off by using a gaseous technique.

In order to form the coating, the part is usually placed on one or more supports with limited contact between the part and the or each support.

For example, with a coating made by chemical vapor deposition or infiltration, the material of the resulting coating 1 is deposited both on the part 2 and on the supports 3, as shown very diagrammatically in FIG. 1A, and in more detail in FIG. 1B. When the part is separated from the support, the rupture which occurs leaves an unprotected zone 4 (FIG. 1C) in particular when the material of the part, such as graphite, is not as strong as the material of the coating such as silicon carbide (SiC).

Such a defect is unacceptable since it leaves an access path for oxygen in the ambient medium to attack the material of the part.

The solution that is generally adopted consists in making a second coating layer 5 (FIG. 1D) by putting the part back on the support after turning it over.

Making two deposits in succession represents substantial extra cost. In addition, the same risk of damage is still possible when separating the part from the support, after the second deposition operation.

A similar difficulty is encountered when the coating of the part needs is to be performed by a liquid technique over the entire outside surface.

OBJECT AND SUMMARY OF THE INVENTION

An object of the invention is to provide a method enabling a continuous coating to be made over the entire surface of a part placed on one or more supports, without having to resort to depositing coating material twice in succession and without any risk of creating a defect in the coating when the part is separated from the support(s).

This object is achieved by a method comprising the steps of:

providing the or each support with a separation layer of a material that is weaker than the material of the coating to be made;

interposing a continuity layer of a component material of the coating to be made between the or each support and the part, at least in the or each support zone;

forming the coating by chemical vapor infiltration or deposition; and subsequently separating the part from the or each support by rupture within the separation layer, the continuity of the coating on the part in the or each support zone being provided by the portion of the coating that comes from the continuity layer and that remains in place on the part.

Thus, the presence of a zone of weakness constituted by the separation layer between the part and the or each support associated with interposing a continuity layer makes it possible to preserve the continuity of the coating as finally formed.

Advantageously, the separation layer is made of a material of flaky structure, separation between the support and the part being achieved by cleavage within said material.

The material of the separation layer may be selected from: laminar type pyrolytic carbon; hexagonal structure boron nitride; flake graphite; or flaky structure alumino-silicates such as talc or clays.

According to a particular feature of the method, the continuity layer is formed on the or each support over the separation layer. Thus, the continuity layer comes into contact with the part when it is placed on the or each support, and it remains on the surface of the part when the support(s) is/are removed with rupture taking place within the separation layer.

In a variant, the continuity layer may be formed locally on the part, at least in its support zone(s).

According to another particular feature of the method, the continuity layer is made of a material similar to that of the coating to be made. Prior surface treatment of the continuity layer is advantageously performed in order to improve bonding with the coating material. This surface treatment may be heat treatment or treatment by acid attack.

In a variant, the continuity layer is made of a porous material. The coating is then made by chemical vapor infiltration with the porous material of the continuity layer being densified, at least partially.

BRIEF DESCRIPTION OF THE DRAWINGS

The invention will be better understood on reading the following description given by way of non-limiting indication, and with reference to the accompanying drawings, in which.

DETAILED DESCRIPTION OF IMPLEMENTATIONS OF THE INVENTION

A first implementation of a method in accordance with the invention is described below in the context of using chemical vapor infiltration to form a continuous coating of silicon carbide (SiC) over the entire surface of a graphite part in order to protect the part from oxidation.

Compared with the chemical vapor deposition process, chemical vapor infiltration is performed under conditions of temperature and pressure which encourage the reactive gas to diffuse within the pores in the surface of the graphite part. Thus, in order to guarantee continuity of the coating and bonding between the coating and the surface of the part, it is preferable to use a chemical vapor infiltration method. The use of chemical vapor deposition methods nevertheless remains within the ambit of the invention, for example low pressure chemical vapor deposition (LPCVD) as used in the electronics industry.

The graphite part 10 to be coated is placed on supports 20 inside a chemical vapor infiltration oven 30. A plurality of parts may be loaded simultaneously into the oven on different trays 32. The SiC coating is obtained by using a gas that may contain methyltrichlorosilane (MTS) as a precursor for SiC. Methods and installations for forming SiC deposits by chemical vapor infiltration are well known. Reference can be made to document EP 0 256 073.

The supports 20 are of conical or pyramid shape, providing tips of limited area in their regions making contact with the part 10. It is possible to envisage using supports of other shape, for example prismatic bars that provide limited contact area along a ridge.

Figure 1A:
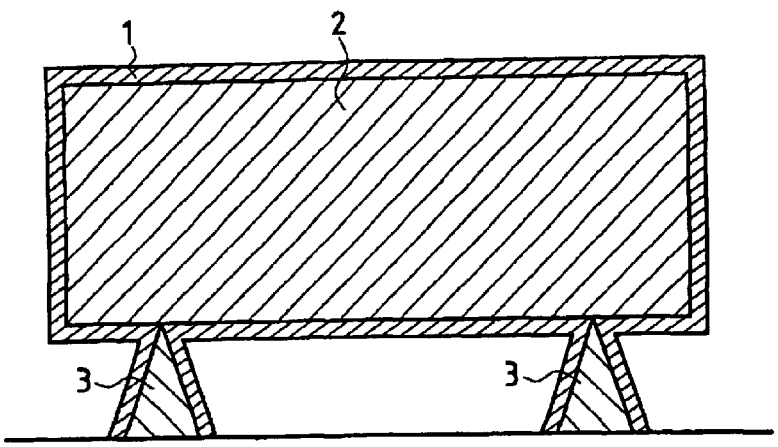
FIGS. 1A to 1D, described above, show the successive steps in a prior art method of forming a continuous coating on a substrate by chemical vapor deposition or infiltration.
Figure 1B:
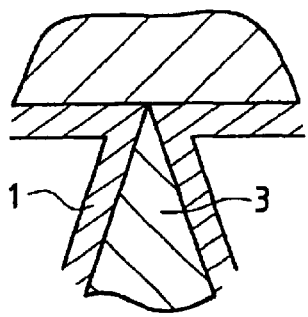
Figure 1C:
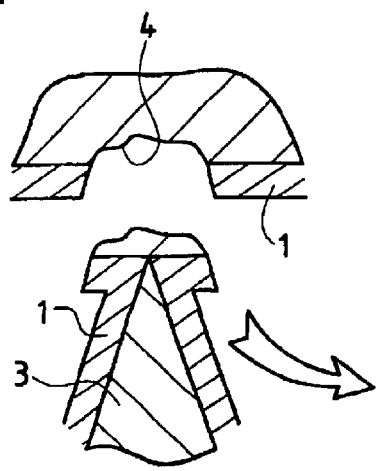
Figure 1D:
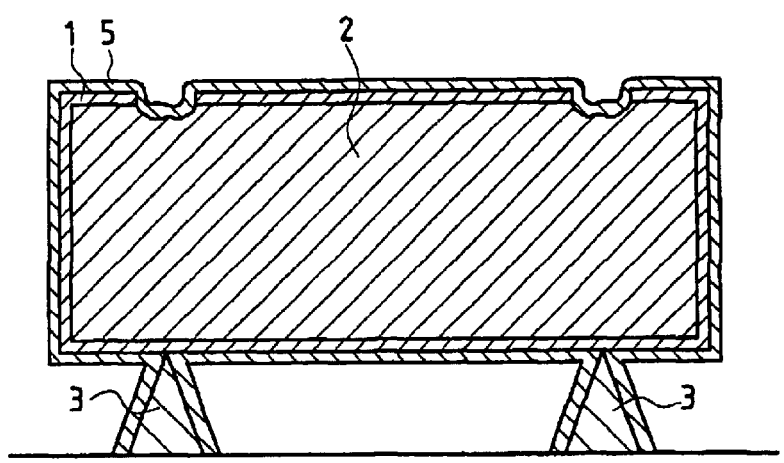
Figure 2:
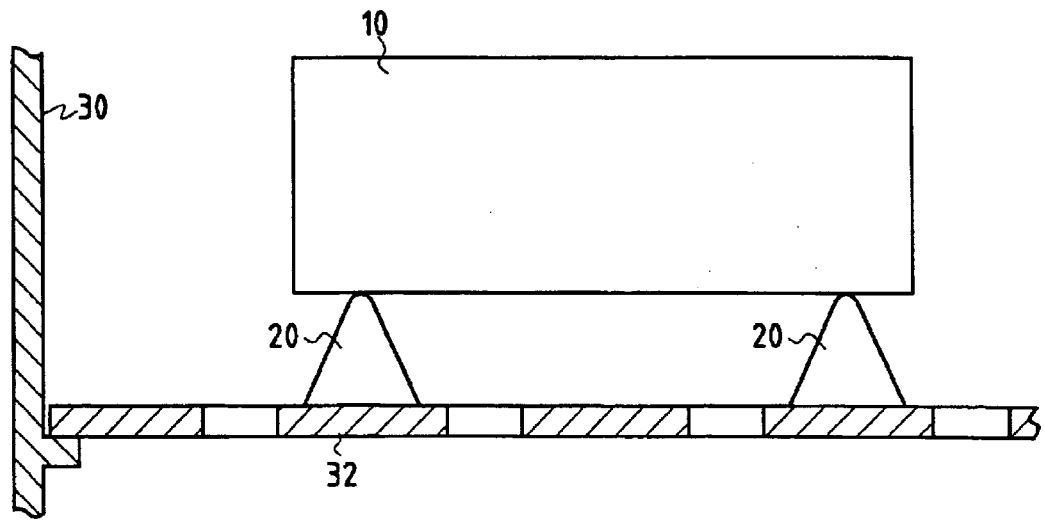
FIG. 2 is a view of a part placed on supports in a chemical vapor infiltration oven.
Figure 3:
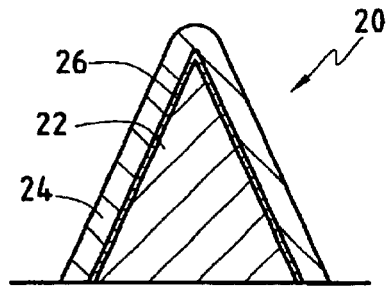
FIG. 3 is a large-scale view in section of a support for a part in an implementation of a method in accordance with the invention.

As shown in greater detail in FIG. 3, each support 20 comprises a substrate 22 of refractory material, e.g. of graphite or of a thermostructural composite material such as a C/C composite material, and an outer layer 24 of silicon carbide for constituting a continuity layer of the SiC coating that is to be made. A separation layer 26 of refractive material that is weaker than the SiC of the layer 24 is interposed between the substrate 22 and the layer 24.

The separation layer 26 defines a zone of weakness. It is advantageously made of a material of flaky structure, or cleavable material, such as laminar type pyrolytic carbon (PyC), hexagonal boron nitride (BN), flake graphite, or other refractory material such as flaky alumino-silicates, e.g. talc or clays.

A layer of PyC or BN can be obtained by chemical vapor infiltration or deposition. Reference can be made to document EP 0 172 082 which describes making a flaky interphase of PyC or BN having low shear strength between the fibers and the matrix of a thermostructural composite material having refractory reinforcing fibers and a ceramic matrix.

A layer of BN or of flake graphite can also be obtained by spraying and then optionally smoothing using a technique known in particular for forming a layer of an unmolding agent on the wall of a mold, for example using the substance based on BN from the French supplier "ACHESON FRANCE" sold under the name "Pulvé Aéro A", or the graphite-based substance from the same supplier and sold under the name "Graphoil D31A".

A layer of talc or of clay can also be obtained by dusting in finely divided form and then smoothing.

The thickness of the layer 26 must be sufficient to make it possible subsequently to achieve separation by rupture within said layer and without damaging the SiC layer 24.

Nevertheless, this thickness must remain relatively small in order to ensure sufficient bonding for the outer layer 24 until final separation.

The thickness of the layer 26 is preferably selected to lie in the range 0.1 micrometers ($\mu$m) to 20 $\mu$m, and typically to lie in the range 0.5 $\mu$m to 5 $\mu$m.

The SiC layer 24 is formed by chemical vapor infiltration or deposition. Its thickness is selected to be not less than that of the coating that is to be formed on the part 10.

Figure 4:
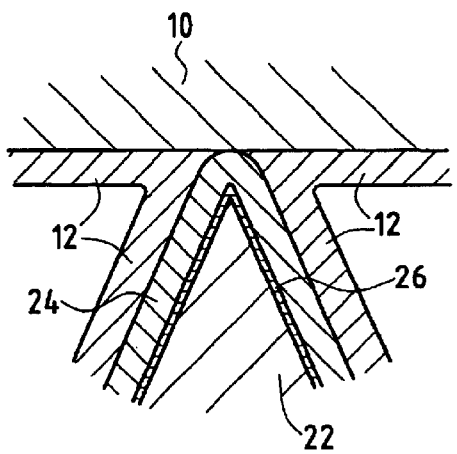
FIG. 4 is a detail view on a large scale of the contact region between a part and a support of the kind shown in FIG. 3, after a coating has been formed by chemical vapor deposition or infiltration.

After being loaded into the oven, an SiC coating 12 is formed on the part 10 and on the exposed side faces of the supports 20, as shown in the detail of FIG. 4.

Figure 5:
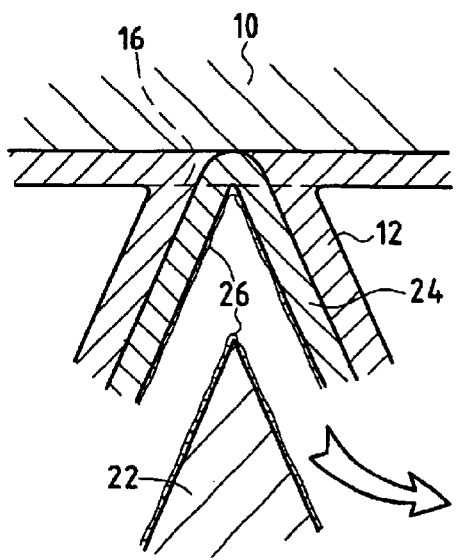
FIG. 5 is a view on a large scale analogous to FIG. 4, after the part and the support have been separated.

Once the coating 12 has been formed, the part 10 is removed from the oven together with the supports 20, and then the supports 20 are physically separated from the part 10. Because of the presence of the weak layer 26, separation between a support and the part takes place within said layer, as shown in FIG. 5.

It is thus ensured that the SiC coating on the part is continuous in its zone of contact with the support, continuity being provided by the layer 24 from the support which remains bonded to the part 10. The excess portion of the layer 24 can subsequently be removed by machining, where necessary (see dashed line 16 in FIG. 5), so as to provide a continuous coating of SiC of substantially constant thickness over the entire surface of the part 10.

In order to provide good bonding between the layer 24 and the coating 12, the layer 24 is preferably made by a chemical vapor infiltration process similar to that used for the coating 12 so as to obtain SiC deposits having the same structure. In addition, prior to making the coating 12, surface treatment may be performed on the surface of the outer layer 24 so as to remove any impurities and/or a film of silica (SiO$_2$) which might have formed thereon, thereby facilitating strong bonding with the coating 12.

Such surface treatment can consist in heat treatment, e.g. at a temperature in the range 1200° C. to 1900° C. under a secondary vacuum. A film of silica is eliminated by reacting with SiC, i.e.:

$$SiC+2SiO_2 \rightarrow 3SiO+CO.$$

In a variant, the surface treatment is acid attack, e.g. using hydrofluoric acid (HF) likewise for eliminating the surface film of SiO$_2$.

Although it is assumed above that an SiC coating is to be formed on a part made of graphite, the method of the invention can be used to form any type of continuous coating suitable for being obtained by chemical vapor infiltration or deposition on various types of substrate. Thus, a continuous coating for providing a part made at least in part out of carbon or graphite in order to protect it against oxidation can be made out of a refractory ceramic material selected in particular from nitrides and from carbides other than SiC. The reagent gas used is selected as a function of the nature of the coating to be formed. Reference can be made by way of example to document FR 2 401 888 which describes making coatings of various kinds by chemical vapor deposition or infiltration.

It should also be observed that forming an outer layer and a separation layer on the supports for parts can be restricted to those zones of the support that are to come into contact with the parts.

Figure 6:
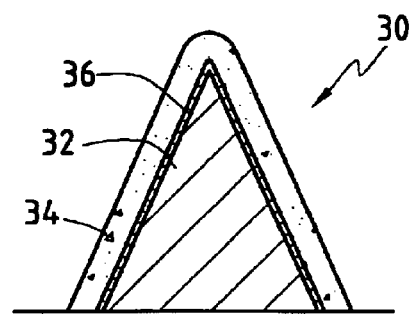
FIG. 6 is a view on a large scale and in section of a support for a part in another implementation of a method in accordance with the invention.

FIG. 6 shows a variant embodiment of a support 30 for supporting a part that is to be coated.

The support 30 comprises a substrate 32 of refractory material provided with a separation layer 36. The substrate 32 and the layer 36 are similar to the substrate 22 and to the layer 26 described above with reference to FIG. 3, for example.

The support 30 differs from the support 20 of FIG. 3 in that it has an outer layer 34 of porous material formed on the separation layer 36. The layer 34 is a layer that is to provide continuity on the coating formed subsequently on a part supported by the support 30.

By way of example, the porous layer 34 is made by depositing a liquid composition on the separation layer 36, at least over the top portion of the support 30, said liquid composition comprising a precursor for a material similar to the material of the coating that is to be formed. For an SiC coating, the precursor can be constituted, for example, by a polycarbosilane (PCS) resin. Other precursors can be used, for example polycarbosiloxanes or silicones. The resin, possibly together with a solvent for adjusting its viscosity can itself be filled with SiC powder. After being coated on the support, the resin is cured and then ceramization is performed by heat treatment.

The part 10 for coating is placed on one or more supports 30 and an SiC coating is formed by chemical vapor infiltration.

Figure 7:
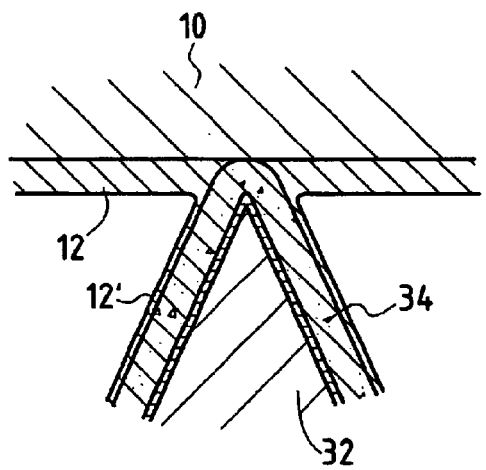
FIG. 7 is a detail view on a large scale of the contact region between a part and a support of the kind shown in FIG. 6, after a coating has been formed by chemical vapor infiltration.

As shown in FIG. 7, after infiltration, the layer 34 is densified and a coating 12 is formed on the part 10. Infiltration is continued until the pores have been filled, at least in the surface portion of the layer 34 and an outer coating 12' has been formed thereon, this coating being thinner than the coating 12.

Figure 8:
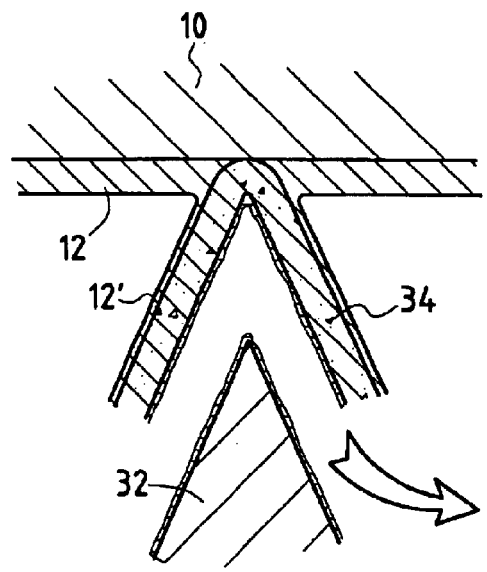
FIG. 8 is a detail view on a large scale analogous to FIG. 7, after the part and the support have been separated.

The support is removed by rupture occurring within the separation layer 36. A continuous SiC coating is obtained over the entire surface of the part 10, with continuity in a support zone being provided by the SiC continuity layer 34, itself densified by SiC (FIG. 8). The excess portions of the layers 34 and 12' can subsequently be removed, where necessary, so as to lie flush with the surface of the layer 12.

Figure 9:
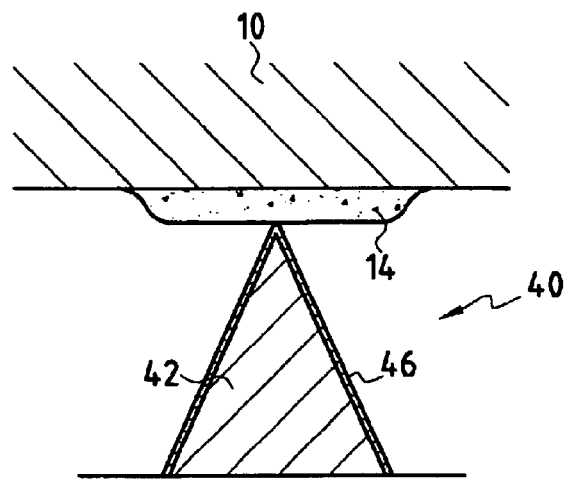
FIG. 9 is a detail view on a large scale in the region of the contact between a support and a part in yet another implementation of a method in accordance with the invention.
Figure 10:
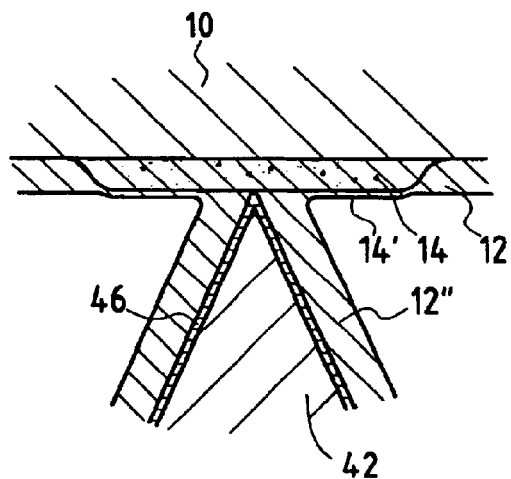
FIG. 10 is a detail view on a large scale similar to FIG. 9, after a coating has been formed by chemical vapor infiltration.
Figure 11:
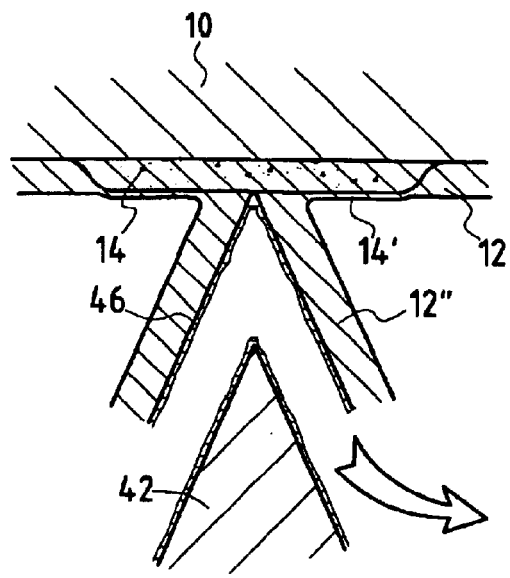
FIG. 11 is a detail view on a large scale similar to FIG. 10, after the support and the part have been separated.

FIGS. 9 to 11 show a variant of the method of FIGS. 6 to 8.

In this variant, a porous continuity layer 14 is formed not on a separation layer 46 of one or more supports 40, but on the surface of the part 10.

The layer 14 is formed on a fraction of the surface of the part 10, possibly in a plurality of separate portions, so as to be present at least in the or each support zone. The support 40 thus rests via the separation layer 46 on the layer 14 (FIG. 9). The material of the layer 14 may be identical to that of the layer 34 as described above. The support 40 comprises a substrate 42 coated by the separation layer 46, these two being similar to the substrate 22 and the separation layer 26 of the support 20 as described above.

An SiC coating is formed by chemical vapor infiltration. The porous layer 14 is densified while the coatings 12 and 12" are formed on the portions of the surface of the parts that are not already coated by the porous layer 14, and also on the separation layer 46. The infiltration is performed in such a manner as to fill the pores of the layer 14, at least in its surface portion, and to develop an outer coating 14' thereon of thickness that is smaller than the thickness of the coating 12 (FIG. 10).

The support is removed by rupture within the separation layer. A continuous SiC coating is obtained over the entire surface of the part, with continuity in the or each support zone being obtained by the continuity layer 14 densified with SiC and provided with the coating 14' (FIG. 11). The excess portion of the coating 12" can be removed, where appropriate, e.g. being made flush with the level of the surface of the coating 14'.

What is claimed is:

1. A method of making a continuous coating over an entire external surface of a part without leaving uncoated any portion of said surface, comprising the steps of:

providing at least one support having a substrate, a separation layer formed over the substrate and a continuity layer formed over the separation layer, the separation layer being made of a material that is weaker than the material of the coating to be made on said part, and the continuity layer being made of a component material of the coating to be made on said part, and the continuity layer being made of a component material of the coating to be made on said part, placing said part to be coated on said at least one support with the continuity layer of the support being in contact with said surface of the part to be coated, forming a coating by chemical vapor infiltration or deposition over said surface of the part and said at least one support, and subsequently separating the part from said at least one support substrate by rupture within the separation layer, the continuity of the coating at the surface of the part at the location of contact with said at least one support being achieved by a potion of coating provided by the continuity layer that remains in place on the part after rupture within the separation layer.

2. A method as claimed in claim 1, wherein the separation layer is made of a material of flaky structure, separation between the support and the part being achieved by cleavage within said material.

3. A method as claimed in claim 2, wherein the material of the separation layer is selected from the group consisting of laminar type pyrolytic carbon; hexagonal structure boron nitride; flake graphite; or flaky structure alumino-silicates such as talc or clays.

4. A method according to claim 1, wherein the continuity layer is made of a porous material.

5. A method according to claim 4, wherein the coating is made by chemical vapor infiltration causing the continuity layer to be densified at least partially.

6. A method according to claim 1, wherein the continuity layer is of a material similar to that of the coating to be made.

7. A method according to claim 6, wherein, prior to chemical vapor infiltration or deposition, surface treatment is performed on the continuity layer in order to enhance bonding with the coating made subsequently.

8. A method according to claim 7, wherein the surface treatment is heat treatment.

9. A method according to claim 7, wherein the surface treatment is acid attack treatment.

10. A method according to claim 1, for making a continuous coating on a part made at least in part out of carbon or graphite to provide the part with protection against oxidation.

11. A method according to claim 1, wherein the continuous coating formed over the entire surface of the part is made of a refractory ceramic material selected from carbides and nitrides.

12. A method according to claim 1, wherein the continuous coating formed over the entire surface of the part is made of silicon carbide.

13. A method of making a continuous coating over an entire external surface of a part eithout leaving uncoated any portion of said surface, comprising the steps of:

providing at least one support having a substrate and a separation layer formed over the substrate, the separation layer being made of a material that is weaker than the material of the coating to be made on said part, forming locally on the surface of said part at least one continuity layer of a component material of the coating to be made on said part, placing said part to be coated on said at least one support with said at least one continuity layer formed at the surface of the part being in contact and resting upon the separation layer of said support, forming a coating by chemical vapor infiltration or deposition over said surface of the part and said at least one support, and subsequently separating the part from said at least one support substrate by rupture within the separation layer, the continuity of the coating at the surface of the part at the location of contact with said at least one support being achieved by a portion of coating provided by the continuity layer that remains in place on, the part after rupture within the separation layer.

14. A method as claimed in claim 13, wherein the separation layer is made of a material of flaky structure, separation between the support and the part being achieved by cleavage within said material.

15. A method as claim in claim 14, wherein the material of the separation layer is selected from: laminar type pyrolytic carbon; hexagonal structure boron nitride; flake graphite; or flaky structure alumino-silicates such as talc or clays.

16. A method as claimed in claim 13, wherein the continuity layer is made of a porous material.

17. A method as claimed in claim 16, wherein the coating is made by chemical vapor infiltration causing the continuity layer to be densified at least partially.

18. A method as claimed in claim 13, wherein the continuity layer is of a material similar to that of the coating to be made.

19. A method as claimed in claim 18, wherein, prior to chemical vapor infiltration or deposition, surface treatment is performed on the continuity layer in order to enhance bonding with the coating made subsequently.

20. A method as claimed in claim 19, wherein the surface treatment is heat treatment.

21. A method as claimed in claim 19, wherein the surface treatment is acid attack treatment.

22. A method as claimed in claim 13, for making a continuous coating on a part made at least in part out of carbon or graphite to provide the part with protection against oxidation.

23. A method as claimed in claim 13, wherein the continuous coating formed over the entire surface of the part is made of a refractory ceramic material selected from carbides and nitrides.

24. A method as claimed in claim 23, wherein the continuous coating formed over the entire surface of the part is made of silicon carbide.

* * * * *